United States Patent
Zhou et al.

(10) Patent No.: US 10,537,019 B1
(45) Date of Patent: Jan. 14, 2020

(54) SUBSTRATE DIELECTRIC CRACK PREVENTION USING INTERLEAVED METAL PLANE

(71) Applicant: NXP USA, Inc., Austin, TX (US)

(72) Inventors: Tingdong Zhou, Austin, TX (US); Twila Jo Eichman, San Marcos, TX (US); Stanley Andrew Cejka, Austin, TX (US); James S. Golab, Austin, TX (US); Chee Seng Foong, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/455,428

(22) Filed: Jun. 27, 2019

(51) Int. Cl.
  *H05K 1/02* (2006.01)
  *H01L 23/00* (2006.01)
  *H01L 23/498* (2006.01)

(52) U.S. Cl.
  CPC ..... *H05K 1/0271* (2013.01); *H01L 23/49822* (2013.01); *H01L 23/562* (2013.01); *H05K 2201/093* (2013.01)

(58) Field of Classification Search
  CPC .................. H05K 1/0271; H05K 2201/093
  USPC .......................................................... 174/255
  See application file for complete search history.

(56) References Cited

U.S. PATENT DOCUMENTS

| | | | | |
|---|---|---|---|---|
| 5,760,429 A | * | 6/1998 | Yano | H01L 23/5226 257/211 |
| 6,117,765 A | * | 9/2000 | Kim | H01L 23/49822 438/624 |
| 7,778,039 B2 | | 8/2010 | Chen et al. | |
| 2014/0339687 A1 | | 11/2014 | Kumar et al. | |
| 2018/0177040 A1 | * | 6/2018 | Yoshida | H05K 1/0215 |

* cited by examiner

*Primary Examiner* — Sherman Ng (57) ABSTRACT

Embodiments of a substrate are provided herein, which include: a first metal plane and a second metal plane in a first metal layer, the first and second metal planes laterally separated by a first gap of dielectric material; and a third metal plane and a fourth metal plane in a second metal layer vertically adjacent to the first metal layer, the third and fourth metal planes laterally separated by a second gap of dielectric material, wherein the second gap comprises a first laterally-shifted gap portion and a second laterally-shifted gap portion, the first laterally-shifted gap portion is laterally offset from a vertical footprint of the first gap in a first lateral direction, and the second laterally-shifted gap portion is laterally offset from the vertical footprint of the first gap in a second lateral direction opposite the first lateral direction.

16 Claims, 9 Drawing Sheets

SUBSTRATE DIELECTRIC CRACK PREVENTION USING INTERLEAVED METAL PLANE

BACKGROUND

Field

This disclosure relates generally to substrates, and more specifically, to preventing crack propagation in dielectric layers of a substrate.

Related Art

Substrates provide mechanical support for one or more electrical components. The substrate may be built up using a number of dielectric material layers and conductive material layers to form conductive structures through the substrate, which for example include power planes, pads, interconnects, and vias.

BRIEF DESCRIPTION OF THE DRAWINGS

The present invention may be better understood, and its numerous objects, features, and advantages made apparent to those skilled in the art by referencing the accompanying drawings.

FIGS. 4A, 4B, and 4C and FIGS. 5A, 5B, 5C, and 5D are block diagrams depicting example substrates having one or more metal planes with interleaved extended metal portions, according to some embodiments of the present disclosure.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

The following sets forth a detailed description of various embodiments intended to be illustrative of the invention and should not be taken to be limiting.

Overview

Figure 1A:
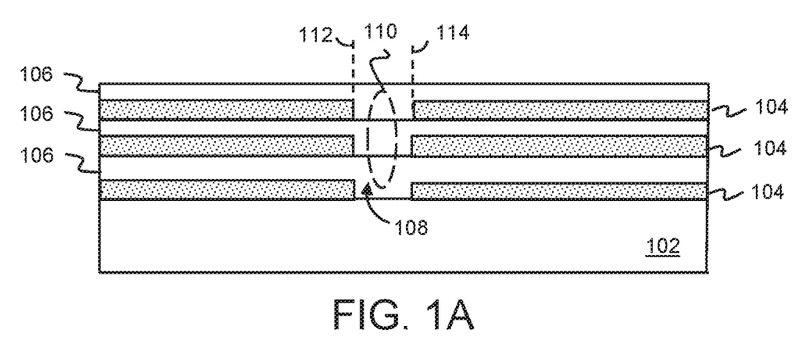
FIGS. 1A and 1B are block diagrams depicting an example substrate with stacked dielectric columns.
Figure 1B:
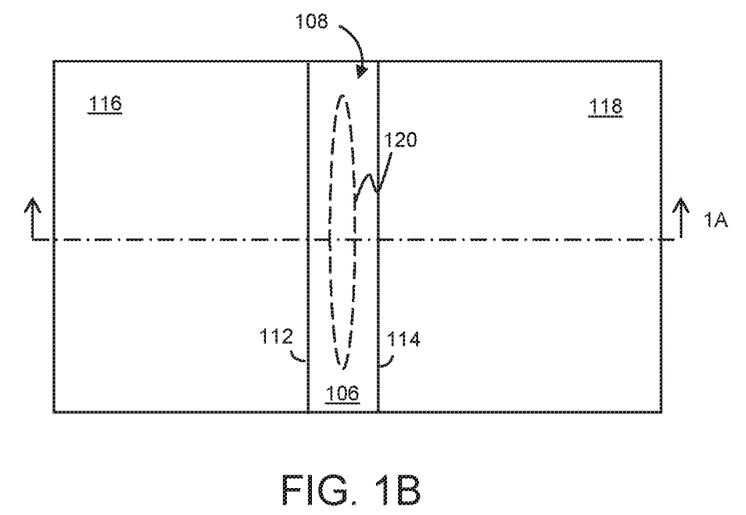

In conventional substrate designs, copper planes implemented on a same layer with different voltages are laterally separated by a gap filled with dielectric material. This design is implemented throughout a substrate, where copper planes in other vertically adjacent layers of the substrate are typically vertically aligned, which also results in the gaps being vertically aligned. For example, FIG. 1A shows a cross-sectional view of alternating layers of copper 104 and layers of dielectric material 106 formed on substrate 102. FIG. 1B shows a top-down view of each layer of copper 104, which includes at least two copper portions, such as left portion 116 and right portion 118, that implement two different copper planes carrying different power supplies (e.g., Vss and Vdd). The copper planes 116 and 118 at each metal layer 104 are laterally adjacent and separated by a gap filled with dielectric material 106, also referred to as gap 108. As shown in FIG. 1B, gap 108 is located between edge 112 of copper plane 116 and edge 114 of copper plane 118. Since the copper planes 116 and 118 of each metal layer 104 are typically designed to have a same shape and size, the edges 112 and 114 of the copper planes are vertically aligned, which also results in the gaps 108 being vertically aligned or stacked. The stacked gaps 108 of dielectric material 106 at each layer forms a tall straight vertical column 110 of uninterrupted dielectric material (e.g., uninterrupted by a metal layer or component), as shown in FIG. 1A. FIG. 1B also shows that the stacked gaps 108 of dielectric material 106 also run laterally along the length of the copper planes, forming a long straight lateral row 120 of uninterrupted dielectric material.

This uninterrupted dielectric material in the vertical and lateral directions (e.g., dielectric material 106 within column 110 and row 120) between the copper planes is weaker in mechanical strength as compared to the adjacent copper planes. During thermomechanical stress tests, the dielectric material may degrade, further reducing the mechanical strength of the uninterrupted dielectric material. As a result, the uninterrupted dielectric material may be prone to cracking, which may expose and damage components of the packaged device. The taller the column or the longer the row of uninterrupted dielectric material, the greater the chance for cracking.

The present disclosure provides metal plane design that "breaks up" or interrupts a tall straight column of dielectric material in a vertical direction, interrupts a long straight row of dielectric material in a lateral direction, or interrupts in both directions by laterally shifting portions of the gap between two metal portions in one or more metal layers. One example of such a design includes implementing an extended portion on a metal plane, also referred to as a "protrusion," while a laterally adjacent metal plane has a complementary retreating portion, also referred to as a "recess." The metal planes may implement protrusions and recesses in an alternating manner, which laterally shifts portions of the gap between the metal planes in different directions (e.g., to the right or to the left). When implemented in a single metal layer or a first metal layer, the laterally shifted gap portions form a "zig-zagging" or "alternating" gap, which breaks up the gap in a sideways lateral direction (e.g., x direction, or left and right directions) along the edges of the planes (e.g., plane edges extend in a y direction, or front-to-back direction), avoiding the creation of a long row of uninterrupted dielectric material. In some embodiments, a second metal layer vertically adjacent to the first metal layer may implement a conventional straight gap. The lateral shifting of the alternating gap in the first metal layer reduces vertical alignment of with the conventional straight gap in the second metal layer, which breaks up the stacked gaps in a vertical direction (e.g., a z direction), avoiding the creation of a tall column of stacked gaps in a vertical direction.

In some embodiments, a second metal layer vertically adjacent to the first metal layer may also implement the disclosed metal plane design. In such embodiments, the alternating gap of the first metal layer should not be vertically aligned with the alternating gap of the second metal layer (e.g., a first alternating gap may be laterally offset in the x or y direction as compared with a second alternating gap, or the first alternating gap may be a mirrored version of the second alternating gap, or both). The protrusions and recesses may be implemented as part of a regularly repeating pattern or implemented in an irregular manner. In some embodiments, a micro via may be formed between a pair of metal layers to further reinforce the mechanical strength of the gap between metal planes.

Example Embodiments

Figure 2A:
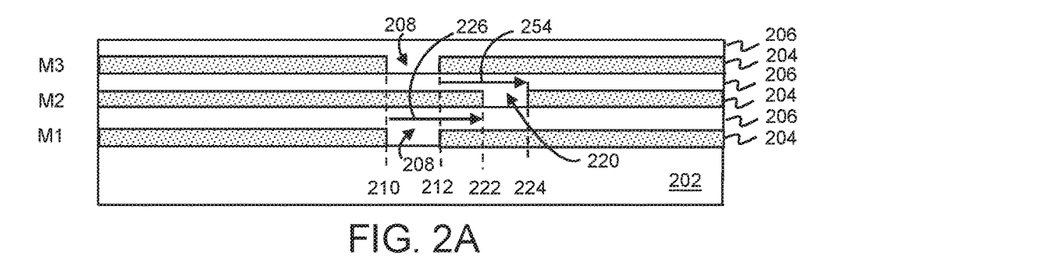
FIGS. 2A, 2B, 2C, and 2D are block diagrams depicting an example substrate having metal planes with extended metal portions, according to some embodiments of the present disclosure.
Figure 2B:
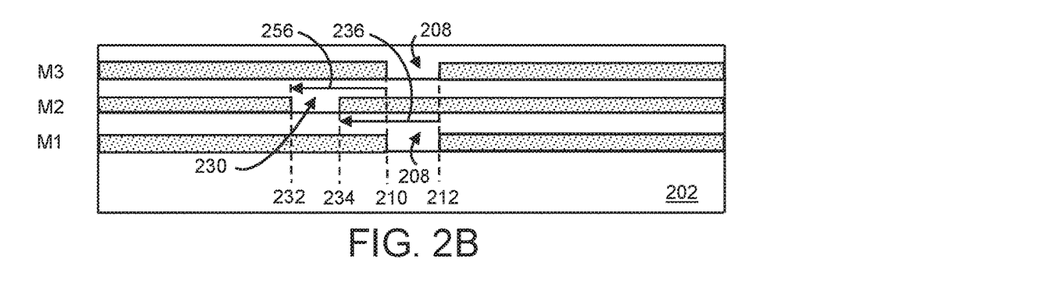
Figure 2C:
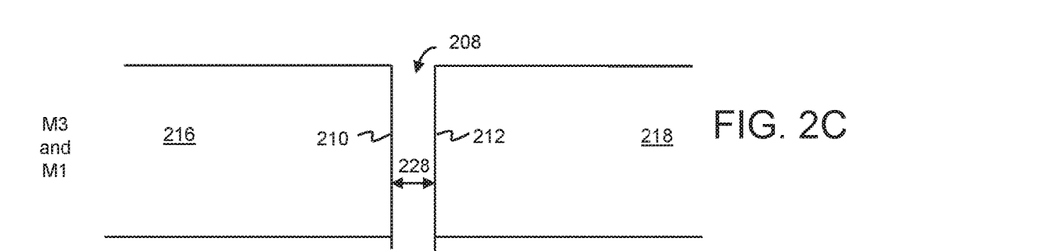
Figure 2D:
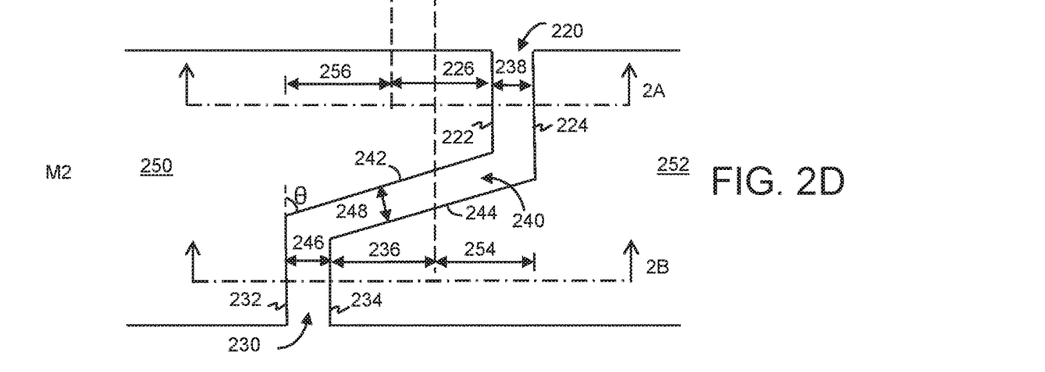

FIG. 2A-2D show aspects of an example device that implements the disclosed metal plane design in metal planes with extended metal portions. FIG. 2A shows a cross-sectional view of alternating layers of metal 204 and layers of dielectric material 206 formed on a substrate 202, which may be implemented in a packaged semiconductor device. In the embodiment shown, first, second, and third metal layers M1, M2, and M3 are implemented on substrate 202, with M1 being closest to substrate 202, M2 being vertically adjacent to M1, and M3 being vertically adjacent to M2. Metal layers M1 and M3 each implement a reference metal plane design shown in FIG. 2C, where gap 208 may also be referred to as a reference gap 208 that provides a reference point for discussion of the disclosed metal plane design of M2, which is shown in FIG. 2D. However, M1 and M3 need not implement such a reference design in other embodiments. For example, M1, M3, or both may implement a design similar to the disclosed metal plane design of M2, or any of the embodiments shown in FIG. 5A-5D, FIG. 6A-6D, FIG. 7A-7C, and FIG. 8A-8B, as further discussed below.

Substrate 202 includes a number of dielectric material layers and conductive material layers that form conductive structures through the substrate 202, which include plating, pads, interconnects, and vias. Such conductive structures are formed from an electrically conductive material, examples of which include but are not limited nickel, gold, copper, aluminum, or other suitable conductive metal or alloy composed of one or more suitable conductive metals. In some embodiments, substrate 202 may be formed on a core that provides a mechanical support structure on which the dielectric and conductive material layers may be formed, such as a metal core, a dielectric core, a glass core, and the like. The dielectric and conductive material layers may be formed over one or both sides of such a core. Substrate 202 may itself provide a mechanical support structure for one or more electronic components, such as a die, a discrete electronic component, another packaged semiconductor device, and the like. Examples of substrate 202 include but are not limited to a package substrate, a laminate substrate, a printed circuit board (PCB), a semiconductor substrate, or other support structure that implements dielectric and conductive material layers that may run the risk of cracking. A semiconductor substrate may be any semiconductor material or combinations of materials, such as gallium arsenide, silicon germanium, silicon-on-insulator (SOI), silicon, monocrystalline silicon, the like, and combinations of the above. It is also noted that the devices shown in the following figures may be representative of a single device or a plurality of devices formed as part of a wafer or panel and then singulated into individual devices.

As shown in the top-down view of FIG. 2C, metal layers M1 and M3 each include a layer of metal 204 that is deposited and patterned to form at least two metal portions 216 and 218 laterally separated by gap 208, which is filled with dielectric material 206. Metal portions 216 and 218 may also be referred to as metal planes or metal plates. In the view shown in FIG. 2C, left metal portion 216 has a right edge 210 closest to right metal portion 218, and right metal portion 218 has a left edge 212 closest to left metal portion 216, where "left" and "right" indicate positions relative to the figures shown herein. Edges 210 and 212 may also be referred to as complementary plate edges of metal portions 216 and 218, which run or extend in a back-and-forth lateral direction, shown as the top-to-bottom direction in FIG. 2C. Gap 208 between edges 210 and 212 has a uniform width 228. The dashed lines shown vertically extending from edges 210 and 212 may also be referred to as a vertical footprint of gap 208. Metal portions 216 and 218 may implement two different metal planes carrying different power supply voltages (e.g., Vss and Vdd).

As shown in the top-down view of FIG. 2D, metal layer M2 includes a layer of metal 204 that is deposited and patterned to form at least two metal portions 250 and 252, which may implement two different metal planes carrying different power supply voltages (e.g., Vss and Vdd). Metal portions 250 and 252 may also be referred to as metal planes or metal plates. Examples of the metal 204 used to implement metal portions such as metal portions 250 and 252 (and other metal portions discussed herein, including metal portions 216 and 218) include but are not limited to nickel, gold, copper, aluminum, or other suitable conductive metal or alloy composed of one or more suitable conductive metals.

Metal portions 250 and 252 are laterally separated by a gap formed by a number of connected gap portions. In the disclosed design, a long linear gap (e.g., shaped like reference gap 208) is "broken up" into a number of gap portions that are shifted away from the underlying gap 208 in a sideways lateral direction (which is perpendicular to the plate edge or top-to-bottom lateral direction), such as by laterally shifting a gap portion to the left or to the right to form an alternating gap (e.g., a "zig-zagging" gap). By laterally shifting the gap portions, the disclosed metal plane design minimizes the amount of the gap in metal layer M2 that vertically aligns with the gap 208 of metal layers M1 and M3.

To achieve the lateral shifting, left and right metal portions 250 and 252 each implement protrusions in an alternating manner, each protrusion having a complementary recess. For example, edge 210 provides a reference edge, shown as a dashed line from FIG. 2C down to FIG. 2D, which is where the right edge of portion 250 would be if the reference metal plane design were implemented. Metal portion 250 has a protrusion extending from reference edge 210 to the right by a length 226, forming a protrusion edge 222, shown at the top of FIG. 2D. Length 226 is greater than the width 228 of gap 208 to ensure that the protrusion extends completely through the vertical footprint of dielectric material 206, which breaks up the dielectric material in the vertical direction to avoid forming a tall vertical column, which also reduces the risk of cracking. A recess is also formed in metal portion 252, complementary to the protrusion of metal portion 250, also shown at the top of FIG. 2D. Edge 212 provides another reference edge, shown as another dashed line from FIG. 2C down to FIG. 2D, which is where the left edge of portion 252 would be if the reference metal plane design were implemented. Metal portion 252 has a recess receding away from reference edge 212 to the right by a depth 254 (where "depth" as used herein indicates a distance receding into a metal portion, relative to the reference edge, as opposed to a "length" extending away from a metal portion, relative to the reference edge), forming a recess edge 224. Edge 222 is separated from edge 224 by a right-shifted gap portion 220 having a width 238. In some embodiments, the width 238 of right-shifted gap portion 220 is equal to the width 228 of gap 208, but need not be in other embodiments. In other words, a portion of the gap between metal portions 250 and 252 (which would otherwise be located similarly as reference gap 208) is laterally offset or shifted to the right at least by a distance equal to length 226. Put another way, edge 222 is laterally offset from edge 210 by length 226 in a first lateral direction (e.g., to the right), and edge 224 is laterally offset from edge 212 by depth 254 in the first lateral direction. Depth 254 may be equal to length 226 in some embodiments to form a same sized gap as gap 208, or may be greater than length 226 in other embodiments to form a wider gap. The cross-section of right-shifted gap portion 220 is shown in FIG. 2A.

Similarly, metal portion 252 has a protrusion extending from reference edge 212 to the left by length 236, forming a protrusion edge 234, shown at the bottom of FIG. 2D. Length 236 is also greater than the width 228 of gap 208 in order to extend through the vertical footprint of gap 208 and reduce the risk of cracking. A complementary recess is formed in metal portion 250, receding away from edge 210 to the left by depth 256, forming a recess edge 232. Edge 232 is separated from edge 234 by a left-shifted gap portion 230 having a width 246. In some embodiments, the width 246 of left-shifted gap portion 230 is equal to the width 228 of gap 208, to width 238, or both, but need not be in other embodiments. Thus, a portion of the gap between metal portions 250 and 252 is laterally offset or shifted to the left at least by a distance equal to length 236. Put another way, edge 234 is laterally offset from edge 212 by length 236 in a second lateral direction (e.g., to the left) opposite the first lateral direction, and edge 232 is laterally offset from edge 210 by depth 256 in the second lateral direction. Depth 256 may be equal to length 236 in some embodiments to form a same sized gap as gap 208, or may be greater than length 236 in some embodiments to form a wider gap. The cross-section of left-shifted gap portion 230 is shown in the cross-sectional view of FIG. 2B.

In some embodiments, the protrusions may have a uniform length on both portions 250 and 252 (e.g., length 226 is equal to length 236). In other embodiments, the protrusions on one metal portion may be longer than those on another metal portion (e.g., length 226 is greater than length 236, resulting in longer right-extending protrusions than left-extending protrusions; or length 236 is greater than length 226, resulting in longer left-extending protrusions than right-extending protrusions). In some embodiments, the recesses may similarly have a uniform depth on both portions 250 and 252 (e.g., depth 254 is equal to depth 256). In other embodiments, the recesses on one metal portion may be deeper than those on another metal portion (e.g., depth 254 is greater than depth 256, or depth 256 is greater than depth 254), where each recess is deep and wide enough to accommodate its complementary protrusion and maintain the necessary gap width around the protrusion. The protrusions may also be viewed as extending from an inner edge of the metal portion, where the protrusions of one metal portion are interdigitated with protrusions of another metal portion. For example, a protrusion having a total length 256+226 may extend from inner edge 232 of metal portion 250, while a protrusion having a total length 254+236 may extend from inner edge 224 of metal portion 252.

Right-shifted gap portion 220 and left-shifted gap portion 230 are connected through an intermediate gap portion 240. In the embodiment shown, protrusion edge 222 of portion 250 is connected to recess edge 232 through an intermediate edge 242, where an angle θ is formed interior to the metal portion 250 at the junction of edges 232 and 242, and again at the junction of edges 222 and 242. Intermediate edge 242 may also be referred to as a lateral edge of the protrusion that extends from reference edge 210 to protrusion edge 222, which then becomes a lateral edge of the recess that recedes from reference edge 210 to recess edge 232. Similarly, recess edge 224 of portion 252 is connected to protrusion edge 234 through intermediate edge 244, where the junction of edges 234 and 244, and the junction of edges 224 and 244 form the same angle θ interior to the metal portion 252. Intermediate edge 244 also forms a lateral edge of the recess that recedes from reference edge 212 to recess edge 224, which becomes a lateral edge of the protrusion that extends from reference edge 212 to protrusion edge 234.

Edges 242 and 244 are separated by an intermediate gap 240 having a width 248. In some embodiments, width 248 is equal to width 246, or to width 238, or to width 208, or to any combination thereof. The transition from right-shifted gap portion 220 to left-shifted gap portion 230 (and from gap portion 230 to gap portion 220) is controlled by angle θ, which may be formed within a range of 15 degrees to 90 degrees, in some embodiments. A small angle may be used for long transitions (e.g., edges 242 and 244 between a protrusion edge and a recess edge are longer), which a large angle may be used for short transitions (e.g., edges 242 and 244 between protrusion and recess edges are shorter). As a result, metal portions 250 and 252 are separated by a gap that includes gap portions 220, 230, and 240. Metal portion 250 has an overall edge made of edges 222, 232, and 242, referred to as a plate edge that runs in the back-and-forth lateral direction that is perpendicular to the sideways lateral direction in which the gap portions are shifted. Metal portion 252 has an overall edge made of edges 224, 234, and 244, also referred to a plate edge that runs in the back-and-forth lateral direction. The plate edges of metal portions 250 and 252 are also referred to as complementary edges of metal portions 250 and 252.

Figure 3A:
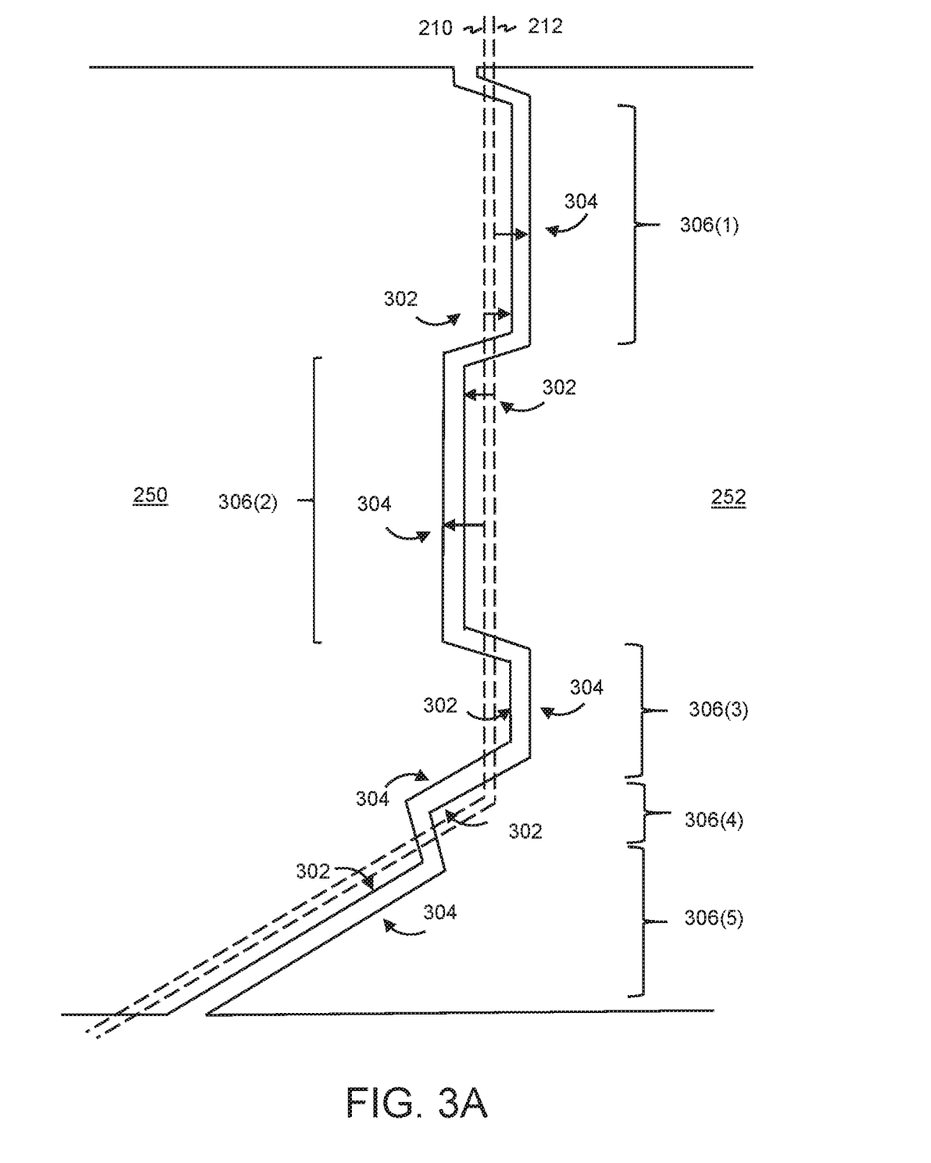
FIGS. 3A and 3B are block diagrams depicting edges of laterally adjacent metal planes in a substrate, according to some embodiments of the present disclosure.

The disclosed metal plane design shown in FIG. 2D may be repeated in an alternating manner (e.g., alternating in opposite directions, such as left and right) along the entirety of the complementary edges of metal portions 250 and 252. Reference edges 210 and 212 are shown as dashed lines. For example, FIG. 3A shows a top-down view of one implementation of an irregularly alternating design, where the protrusions and recesses may not have a uniform width. One complementary pair 306(1) of a protrusion 302 and a recess 304 in a first direction (e.g., to the right) is shown at the top of FIG. 3A, where protrusion 302 extends to the right from reference edge 210 and recess 304 recedes to the right from reference edge 212, which is also referred to as complementary pair 306(1) shifting to the first direction (e.g., to the right). A second complementary pair 306(2) in a second direction opposite the first direction (e.g., to the left) is also shown in FIG. 3A, which includes a protrusion 302 extending to the left from reference edge 212 and a recess 304 receding to the left from reference edge 210, which is also referred to as complementary pair 306(2) shifting to the second direction (e.g., to the left). Another complementary pair 306(3) is shown shifting to the first direction (e.g., to the right).

The complementary pairs of protrusions and recesses generally alternate directions in this manner along the complementary edges of portions 250 and 252. Put another way, the plate edge of metal portion 250 implements alternating protrusions and recesses, and the plate edge of metal portion 252 implements alternating protrusions and recesses, where each protrusion on one plate edge has a complementary recess on the other plate edge. However, as the direction of the reference edges 210 and 212 changes, the direction of the complementary pairs may also change to ensure a protrusion extends across the vertical footprint of gap 208 formed by reference edges 210 and 212 to avoid creation of a tall vertical column of dielectric material 206 like column 110. For example, complementary pair 306(3) includes a right-extending protrusion and right-receding recess, shifting to the right. When the reference edges 210 and 212 angle to the left, the lateral edges of protrusion 302 and recess 304 of pair 306(3) respectively transition into lateral edges of recess 304 and protrusion 302 of pair 306(4). The next complementary pair 306(5) includes a right-extending protrusion and right-receding recess (shifting to the right) to follow the edges 210 and 212 angling to the left.

Figure 3B:
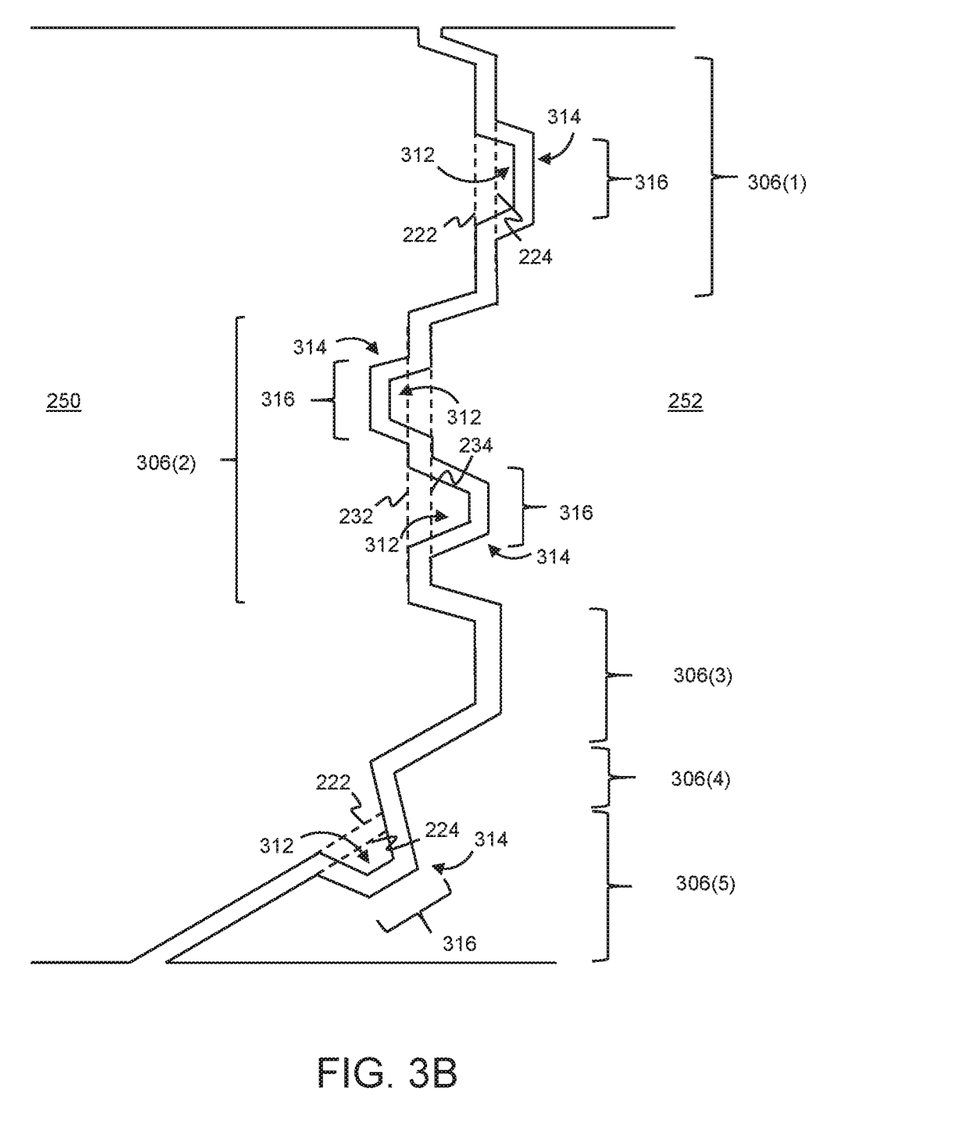

FIG. 3B shows another embodiment of the disclosed metal plane design where additional protrusions may be implemented in an irregular manner to further break up the gap in a lateral direction. For example, complementary pair 306(1) includes another smaller protrusion, or tongue 312, that extends from protrusion edge 222 of portion 250 to the right, as well as another small recess 314 that recedes from recess edge 224 to the right. The tongue 312 and recess 314 form a small complementary pair 316, which is also referred to as pair 316 shifting to the right. Two small complementary pairs are implemented in (large) complementary pair 306(2), with a top pair 316 including a tongue 312 that extends from protrusion edge 234 of portion 252 to the left, and a small recess 314 that recedes from recess edge 232 to the left, also referred to as pair 316 shifting to the left. Pair 306(2) also includes a bottom pair 316 that shifts to the right.

Figure 4A:
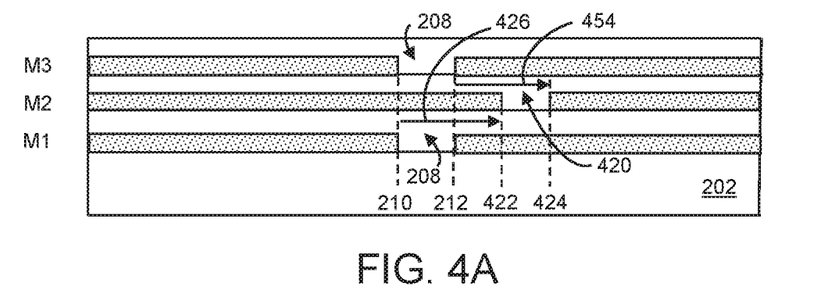
Figure 4B:
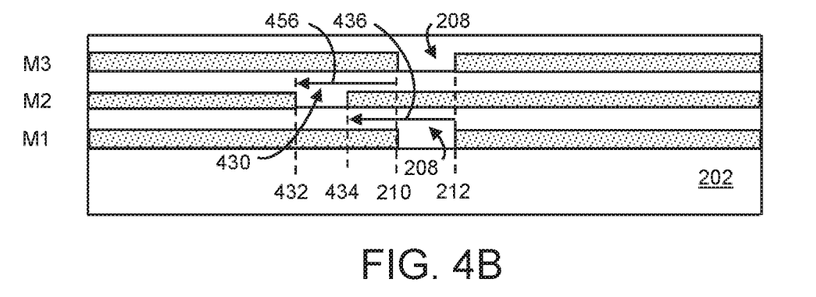
Figure 4C:
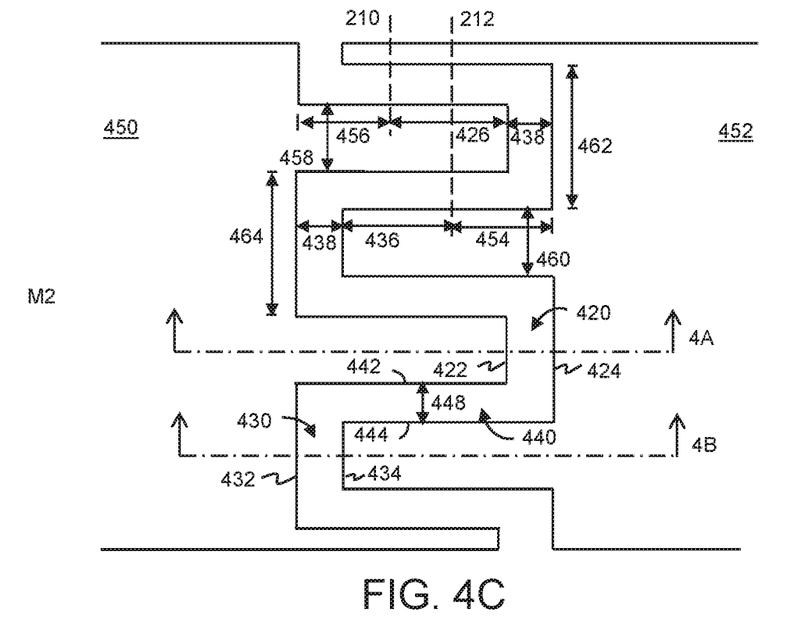

FIG. 4A-4C show aspects of another embodiment of the disclosed metal plane design. In the embodiment shown, the protrusions and recesses are implemented in an alternating manner as part of a regularly repeating pattern along the complementary edges of metal portions 450 and 452, which are left and right metal portions implemented in metal layer M2 and shown in further detail in FIG. 4C. Metal layers M1 and M3 implement reference gaps 208 according to the reference metal plane design discussed above and shown in FIG. 2C, with reference edges 210 and 212 shown as dashed lines in FIG. 4C. Components having similar reference numerals in the following figures correspond to components previously discussed above. Some reference numerals are omitted from the following figures for simplicity's sake, such as the dielectric material 206 and metal 204.

FIG. 4A shows a cross-sectional view of metal layer M2 implementing a right-shifted gap portion 420, and FIG. 4B shows a cross-sectional view of metal layer M2 implementing a left-shifted gap portion 430. FIG. 4C shows a top-down view of metal layer M2, which implements gap portion 420 having a uniform width 438 formed between protrusion edge 422 of metal portion 450 and recess edge 424 of metal portion 452, and gap portion 430 also having uniform width 438 formed between protrusion edge 434 of metal portion 452 and recess edge 432 of metal portion 450. FIG. 4C also shows intermediate gap portion 440 as the transition between right and left-shifted gap portions 420 and 430, formed at a 90 degree angle to directly connect gap portions 420 and 430 in a minimal distance. Intermediate gap portion 440 has a uniform width 448 formed between edge 442 of metal portion 450 and edge 444 of metal portion 452. Edges 442 and 444 may also be referred to as lateral or side edges of the protrusions (e.g., each protrusion on both metal portions 450 and 452 have a side 442 and a side 444 that are perpendicular to either protrusion edge 422 or 434). In some embodiments, width 448 may be equal to width 438, but need not be in other embodiments.

In the embodiment shown, all protrusions of metal portion 450 have a uniform length 426 extending from reference edge 210 (e.g., extending to the right), and all protrusions of metal portion 452 have a uniform length 436 extending from reference edge 212 (e.g., extending to the left). In some embodiments, length 426 may be equal to length 436, but need not be in other embodiments. Lengths 426 and 436 are both larger than width 238 of reference gap 208. The protrusions extending from metal portion 450 have a uniform width 458, and the protrusions extending from metal portion 452 have a uniform width 460. In some embodiments, width 458 may be equal to width 460, but need not be in other embodiments. Also in the embodiment shown, all recesses of metal portion 452 have a uniform depth 454 receding from reference edge 212 (e.g., receding to the right), and all recesses receding into metal portion 450 have a uniform depth 456 receding from reference edge 210 (e.g., receding to the left). In some embodiments, depth 456 may be equal to depth 454, but need not be in other embodiments. The recesses receding into metal portion 452 have a uniform width 462, and the recesses receding into metal portion 450 have a uniform width 464. As shown, width 462 is equal to protrusion width 458 plus the intermediate gap width 448 on either side of the protrusion, and width 464 is equal to protrusion width 460 plus the intermediate gap width 448 on either side of the protrusion. In some embodiments, width 462 is equal to width 464, but need not be in other embodiments.

Figure 5D:
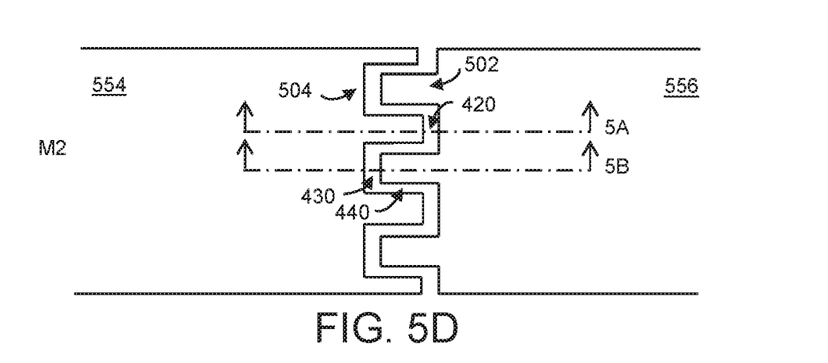

FIG. 5A-5D show aspects of another embodiment of the disclosed metal plane design. In the embodiment shown, the protrusions and recesses are implemented in an alternating manner as part of a regularly repeating pattern in multiple metal layers. Metal layers M1 and M3 implement left and right metal portions 550 and 552, which are shown in further detail in FIG. 5C, and metal layer M2 implements left and right metal portions 554 and 556, which are shown in further detail in FIG. 5D. FIG. 5C shows metal layers M1 and M3 implement a metal plane design similar to that shown in FIG. 4C. FIG. 5D shows metal layer M2 implements an inverted or mirrored version of the metal plane design shown in FIG. 4C.

FIG. 5A shows a cross-sectional view of metal layers M1 and M3 implementing a left-shifted gap portion 430, while metal layer M2 implements a right-shifted gap portion 420. FIG. 5B shows a cross-sectional view of metal layers M1 and M3 implementing a right-shifted gap portion 420, while metal layer M2 implements a left-shifted gap portion 430. Protrusions 502 and recesses 504 are similar to the protrusions and recesses discussed above in connection with FIG. 4A-4C. However, in the embodiment shown, the laterally-shifted gap portions of one metal layer, like layer M2, may be laterally offset from the vertical footprint of a laterally-shifted gap portion in another vertically adjacent metal layer, like layer M1 (e.g., below M2) or M3 (e.g., above M2). For example, FIG. 4A shows right-shifted gap portion 420 in M2 being laterally offset from gap portion 430 in M1 or M3, which is used as a reference gap to ensure the gap portion in M2 is not vertically aligned with the gap portion in M1 or M3. Length 426 of the protrusion that laterally shifts right-shifted gap portion 420 in M2 is greater than the gap width 438 of the vertical footprint of gap portion 430 in M1 or M3. Similarly, FIG. 4B shows left-shifted gap portion 430 in M2 being laterally offset from gap portion 420 in M1 or M3, where length 426 of the protrusion is greater than the gap width 438 of the vertical footprint of gap portion 430 in M1 or M3.

Each metal portion may implement a different set of dimensions for the protrusions and recesses formed on the respective portion, as long as each recess is deep and wide enough to accommodate the complementary protrusion and maintain the necessary gap width around the protrusion. In some embodiments, protrusions 502 and recesses 504 on metal portions 550, 552, 554, and 556 may have one or more commonly sized dimensions, such as a uniform length (such as a single length 426 for protrusions 502 in one metal layer or in all metal layers), a uniform depth (such as a single depth 454 for recesses 504 in one metal layer or in all metal layers), a uniform protrusion width (such as a single width 458 for all protrusions 502 in one metal layer or in all metal layers), a uniform recess width (such as a single width 462 for all recesses 504 in one metal layer or in all metal layers), a uniform gap width (such as a single gap width 438 in one metal layer or in all metal layers), and any combination thereof. For simplicity's sake, protrusions and recesses in metal portions 550, 552, 554 and 556 are shown as having uniform sizes (e.g., uniform length 426 and uniform depth 454, as well as uniform protrusion and recess widths).

As shown in the top-down view of FIG. 5C, protrusions 502 and complementary recesses 504 are formed along the complementary edges of metal portions 550 and 552 in an alternating and regularly repeating pattern, shifting gap portions in either lateral direction (e.g., left and right) to prevent alignment of the gap portions and thus prevent formation of a tall column of dielectric material. Put another way, the plate edge of metal portion 550 implements alternating protrusions and recesses according to a first pattern, and the plate edge of metal portion 552 implements alternating protrusions and recesses according to a second pattern that is complementary to the first pattern, where each protrusion of metal portion 550 has a matching or complementary recess (e.g., dimensions of the recess accommodate dimensions of the respective protrusion) in metal portion 552, and similarly each protrusion of metal portion 552 has a complementary recess in metal portion 550. As shown in the top-down view of FIG. 5D, protrusions 502 and complementary recesses 504 are similarly formed along the complementary edges of metal portions 554 and 556 in an alternating and regularly repeating pattern, but in an inverted or mirrored design as compared with the pattern shown in FIG. 5C (e.g., the first and second patterns of FIG. 5C are laterally mirrored to achieve third and fourth patterns in FIG. 5D). For example, a first protrusion 502 is shown at the top of FIG. 5C extending in one direction (e.g., to the right), while a second protrusion 502 is shown at the top of FIG. 5D in a position vertically aligned with the first protrusion 502 (e.g., above a protrusion in M1 or below a protrusion in M2) and extending in an opposite direction (e.g., to the left). Such a design prevents the left-shifted and right-shifted gap portions 420 and 430 from being vertically aligned with one another.

In this example, the intermediate gap portions 440 may be vertically aligned with one another. However, the length of the intermediate gap portions 440 in the lateral direction perpendicular to the edges of the metal portions (e.g., in the left-to-right direction) is much shorter than compared to the full length of the edges of the metal portions in the lateral direction parallel to the edges of the metal portions (e.g., in the front-to-back direction shown as the top-to-bottom direction, relative to the drawing page), which reduces the risk of cracking. In another embodiment, the width 458 of protrusions 502 implemented in metal portions 550 and 552 may be different than the width 460 of protrusions 502 implemented in metal portions 554 and 556, which offsets the side edges 442 and 444 of protrusions 502 and avoids vertical alignment of the intermediate gap portions 440. Another embodiment directed to minimizing the vertical alignment of the intermediate gap portions 440 is shown in FIG. 6A-6D.

FIG. 6A-6D show aspects of another embodiment of the disclosed metal plane design. In the embodiment shown, the protrusions and recesses are implemented in an alternating manner as part of an irregular pattern in multiple metal layers. In the example shown, metal layer M1 implements left and right metal portions 216 and 218 according to the reference plane design shown in FIG. 2C with reference edges 210 and 212 shown as dashed lines in FIGS. 6C and 6D, metal layer M2 implements left and right metal portions 654 and 656 according to the disclosed metal plane design shown in FIG. 6D, and metal layer M3 implements left and right metal portions 650 and 652 according to the disclosed metal plane design shown in FIG. 6C.

Figure 6A:
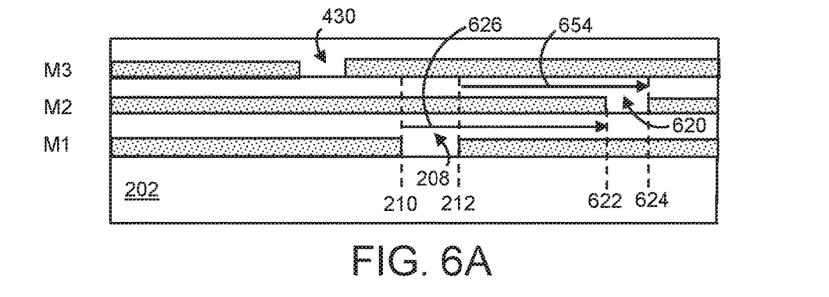
FIGS. 6A, 6B, 6C, and 6D are block diagrams depicting another example substrate having one or more metal planes with irregular interleaved extended metal portions, according to some embodiments of the present disclosure.
Figure 6B:
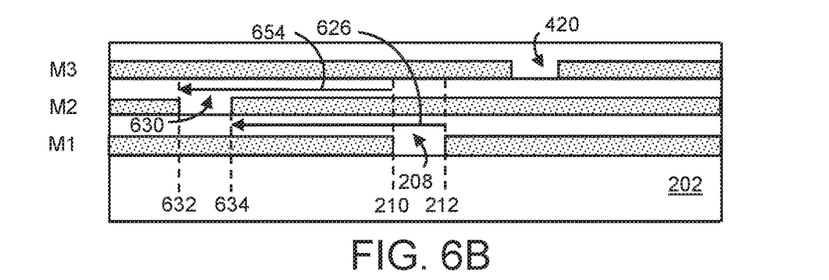

FIG. 6A shows a cross-sectional view of metal layer M1 implementing a reference gap 208, metal layer M2 implementing a right-shifted gap portion 620, and metal layer M3 implementing a left-shifted gap portion 430. FIG. 6B shows a cross-sectional view of metal layer M1 implementing a reference gap 208, metal layer M2 implementing a left-shifted gap portion 630, and metal layer M3 implementing a right-shifted gap portion 420. In the embodiment shown, gap portions 420 and 430 are implemented using a uniform length 426 and uniform depth 454, but may implement different lengths in other embodiments. Also in the embodiment shown, gap portions 620 and 630 are implemented using a uniform length 626 and a uniform depth 654, but may implement different lengths in other embodiments. In the metal plane design implemented in FIG. 6C and FIG. 6D, length 626 is larger than length 426, and depth 654 is larger than depth 454.

Figure 6C:
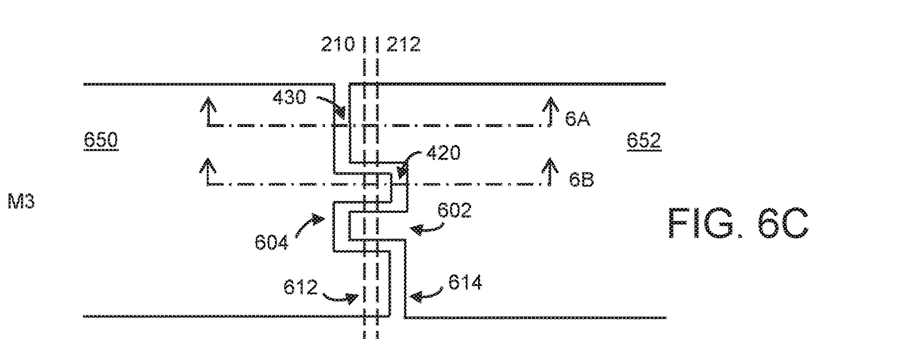

As shown in the top-down view of FIG. 6C, metal portions 650 and 652 implement protrusions 602 and 612 that have a same length 426 with different protrusion widths. For example, protrusion 602 has a shorter width than protrusion 612. Similarly, metal portions 650 and 652 also implement complementary recesses 604 and 614 that have a same depth 454 with different recess widths, as long as the recess widths accommodate the width of the complementary protrusion and intermediate gap widths on either side of the protrusion. For example, recess 604 has a shorter width than recess 614. The protrusions 602 and 612 and complementary recesses 604 and 614 need not be implemented in a regular pattern. For example, protrusions 602 and 612 and complementary recesses 604 and 614 may be implemented in an irregular manner (e.g., randomly or in a design that minimizes vertical alignment of intermediate gap portions and laterally shifted gap portions in multiple metal layers) along the complementary edges of metal portions 650 and 652. Additional protrusions and complementary recesses with a same length but different widths may also be implemented along the complementary edges of metal portions 650 and 652 in other embodiments.

Figure 6D:
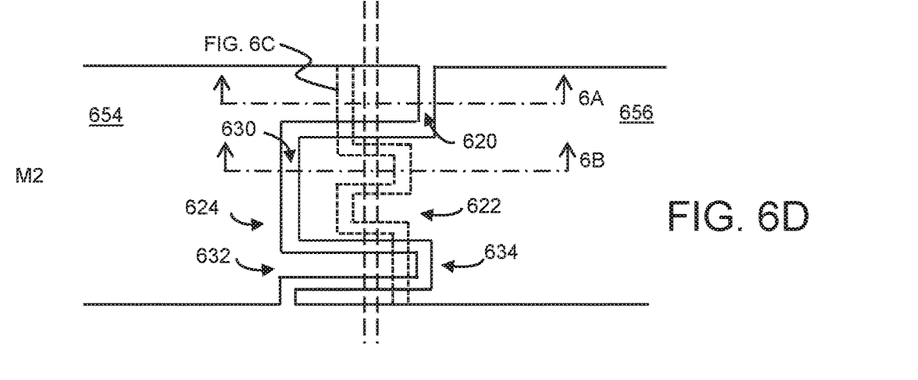

As shown in the top-down view of FIG. 6D, metal portions 654 and 656 implement protrusions 622 and 632 that have a same length 626 with different protrusion widths. For example, protrusion 632 has a shorter width than protrusion 622. Similarly, metal portions 654 and 656 implement complementary recesses 624 and 634 that have a same depth 654 with different recess widths, as long as the recess width accommodate the width of the complementary protrusion and intermediate gap widths on either side of the protrusion. For example, recess 624 has a wider width than recess 634. The protrusions 622 and 632 and complementary recesses 624 and 634 need not be implemented in a regular pattern. For example, protrusions 622 and 632 and complementary recesses 624 and 634 may be implemented in an irregular manner (e.g., randomly or in a design that minimizes vertical alignment of intermediate gap portions and laterally shifted gap portions in multiple metal layers) along the complementary edges of metal portions 654 and 656. Additional protrusions and complementary recesses with a same length but different widths may be implemented along the complementary edges of metal portions 654 and 656 in other embodiments.

In addition to showing the gap formed in M2 in solid lines, FIG. 6D shows the reference gap 208 in M1 formed by reference edges 210 and 212 as long dashed lines down the middle of the drawing. FIG. 6D also reproduces the outline of the gap in M2 shown in FIG. 6C in small dashed lines, for comparison's sake. Comparing the gaps formed in metal layers M1, M2, and M3, the portions of the gaps that are vertically aligned over one another are further reduced, preventing the formation of tall columns or long rows of uninterrupted portions of dielectric material. For example, in the embodiment shown, the metal plane designs of M2 and M3 prevent the vertical alignment of intermediate gap portions and laterally shifted gap portions (e.g., none of the intermediate gap portions in the three metal layers overlap, and none of the laterally shifted gap portions in the three metal layers overlap one another). Small portions of the intermediate gap portions in one metal layer may overlap small portions of the laterally shifted gap portions in another metal layer (e.g., left- and right-shifted gap portions of M3 overlap intermediate gap portions of M2). However, such portions are limited in their vertical alignment (e.g., the small gap portions may overlap in two metal layers, not in all three metal layers) and their lateral alignment (e.g., the small gap portions have a lateral footprint limited by the width of the intermediate gap portion in one direction and the width of the laterally shifted gap portion in a perpendicular direction).

Figure 7A:
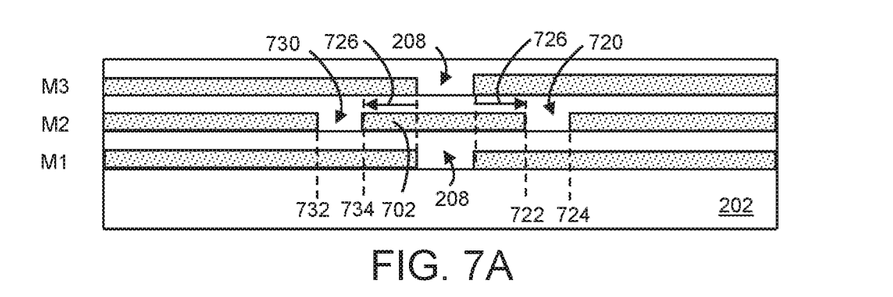
FIGS. 7A, 7B, and 7C are block diagrams depicting another example substrate having metal planes with intervening metal portions, according to some embodiments of the present disclosure.
Figure 7B:
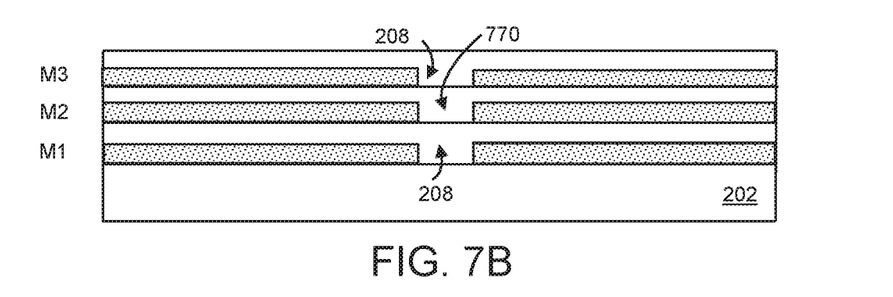
Figure 7C:
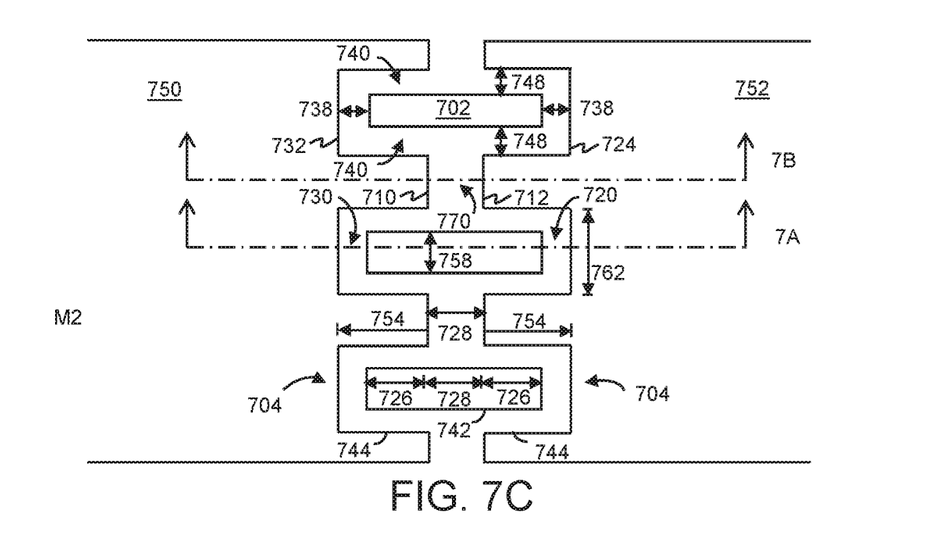

FIG. 7A-7C show another embodiment of the disclosed metal plane design, which include intervening metal portions located between metal portions in a given metal layer. In the example shown, metal layers M1 and M3 implement left and right metal portions 216 and 218 according to the reference plane design shown in FIG. 2C. Metal layer M2 implements left and right metal portions 750 and 752 according to the disclosed metal plane design shown in FIG. 7C, which includes the intervening metal portions.

FIG. 7A shows a cross-sectional view of metal layers M1 and M3 implementing a reference gap 208, and metal layer M2 implementing both a right-shifted gap portion 720 and a left-shifted gap portion 730 with an intervening metal portion 702 forming the respective interior edges 722 and 734 of the gap portions 720 and 730. Edges 722 and 734 may also be referred to as protruding edges of the intervening metal portion 702. Edge 732 of metal portion 750 forms the outer edge of gap portion 730 and edge 724 of metal portion 752 forms the outer edge of gap portion 720. FIG. 7B shows a cross-sectional view of metal layers M1 and M3 implementing the reference gap 208, and metal layer M2 implementing a centered gap portion 770, where the top-down view of FIG. 7C shows gap portion 770 formed by edge 710 of metal portion 750 and edge 712 of metal portion 752, and having a width 728. In the embodiment shown, centered gap portion 770 has a width 728 equal to width 228 of reference gap 208, but need not be in other embodiments. Gap portions 720 and 730 each have a uniform width 738.

Each intervening metal portion 702 is positioned to extend completely through the vertical column of dielectric material 206 that would otherwise be formed by vertical alignment of reference gaps 208 in FIG. 7A (e.g., interrupting or intersecting the vertical footprint of gap 208), which breaks up the dielectric material in the vertical direction and reduces the risk of cracking. Each intervening metal portion 702 extends in both lateral directions (e.g., left and right) to protrude or extend by a same length 726 toward metal portions 750 and 752. Using edges 710 and 712 as reference edges, intervening metal portion 702 extends to the right from edge 712 by uniform length 726 and extends to the left from edge 710 by uniform length 726, giving a total length of 726+728+726. A complementary recess 704 is also formed in both metal portions 750 and 752 on either side of the intervening metal portion to accommodate the intervening metal portion 702 extending in both lateral directions, similar to accommodating a protrusion, as discussed above. Each complementary recess 704 has a depth 754 receding away from the reference edges in both lateral directions. For example, a recess 704 recedes to the left of edge 710 by depth 754 in metal portion 750, while another recess 704 recedes to the right of edge 712 by depth 754 in metal portion 752. Each complementary recess 704 has a width 762 that accommodates the width 758 of the intervening metal portion 702 and the width 748 of the intermediate gap portions 740 on either side of the intervening metal portion 702. The portions of edges 710 and 712 that include a recess may be referred to as recessed portions, and the portions of edges 710 and 712 that do not include a recess may also be referred to as non-recessed portions. Centered gap portions 770 separate non-recessed portions of edges 710 and 712. Each intervening metal portion 702 has lateral edges 742, which in combination with recess lateral edges 744 form intermediate gap portions 740 having a width 748 on either side of the intervening metal portion 702. Put another way, an intermediate gap portion 740 is adjacent to each lateral side of the intervening metal portion 702.

The intervening metal portions 702 may be implemented as part of a regular pattern between the complementary edges of metal portions 750 and 752 in metal layer M2. For example, each intervening metal portions 702 may be regularly spaced, separated from one another by some uniform distance measured in the front-to-back direction along the plane edges. It is preferred that the metal plane design of FIG. 7C be implemented as a single metal layer in between other metal layers (e.g., "sandwiched" in between metal layers that implement a different metal plane design). For example, a metal layer above M2, a metal layer below M2, or both may implement a different design, such as a reference plane design like that shown in FIG. 2C or another disclosed metal plane design like that shown in FIG. 4C, in order to prevent vertical alignment of gap portions.

Figure 8A:
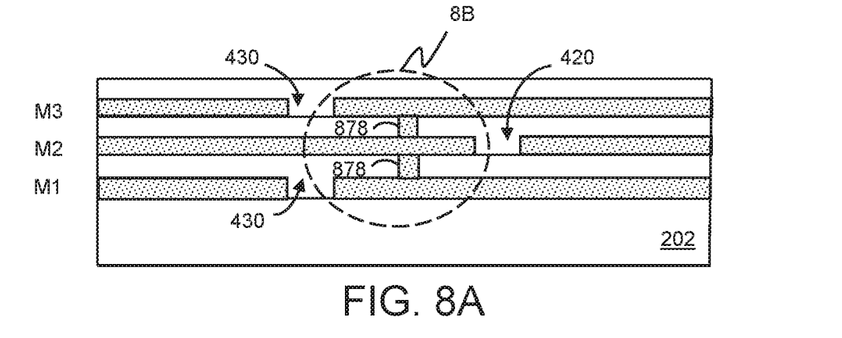
FIGS. 8A and 8B are block diagrams depicting another example substrate having metal planes with extended metal portions and metal posts, according to some embodiments of the present disclosure.
Figure 8B:
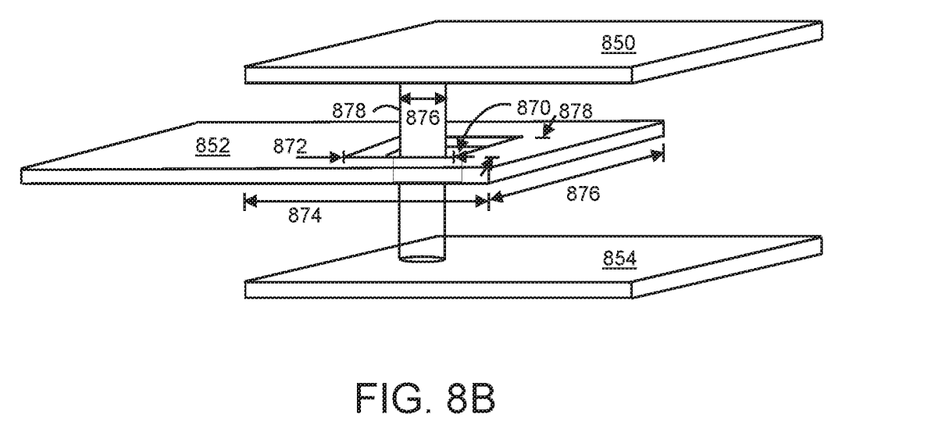

FIGS. 8A and 8B show another embodiment of the disclosed metal plane design, which include micro vias or metal posts formed along the complementary edges of metal portions to connect metal portions in different metal layers.

The metal posts may be implemented in combination with any of the above disclosed metal plane designs to further reinforce the mechanical strength of the gap and avoid cracking. In the example shown, metal layers M1 and M3 implement the disclosed metal plane design according to FIG. 5C and metal M2 implements the disclosed metal plane design according to FIG. 5D (e.g., the mirrored design), as described above. As shown in the cross-sectional view of FIG. 8A, a micro via or similar metal post 878 is formed to connect a metal portion in M3 to a metal portion 854 in M1, which is shown in further detail in FIG. 8B.

FIG. 8B shows a metal portion 850 in metal layer M3 connected to metal portion 854 in metal layer M1 through metal post 878 that has some width (or diameter) 876. In the embodiment shown, metal portion 852 of metal layer M2 includes a window or similar opening 870, which has a width 872 greater than width 876 of the metal post 878. Depending on the voltages carried by the metal portions 850, 852, and 854, the position of the metal posts 878 and size of window 870 may be selected to ensure that the metal post 878 does not short metal portions that carry different voltages. Metal portion 852 extends laterally (e.g., left or right) between metal portions 850 and 854 as a protrusion discussed above. The protrusion of metal portion 852 is large enough to accommodate the size of the window 870. In the embodiment shown, length 874 of the protrusion extended to the right is larger than the length 872 of window 870, and width 876 of the protrusion is larger than the width 878 of window 870. A plurality of microvias may be formed in the front-to-back direction, each microvia passing through a respective window 870 on a respective protrusion, where the protrusion may be extending in the first lateral direction or in the second lateral direction. Depending on the width 876 of each protrusion, multiple windows may be implemented on each protrusion, with multiple microvias passing through the windows and connecting a metal portion above M2 with a metal portion below M2. For example, the embodiment shown in FIG. 4A may include microvias, where microvias may connect metal portion 218 in M3 and metal portion 218 in M1, passing through a window in the protrusion of metal portion 450 in M2. Similarly, in the embodiment shown in FIG. 4B, microvias may connect metal portion 216 in M3 and metal portion 216 in M1, passing through a window in the protrusion of metal portion 452 in M2. In such an example, two rows of microvias are then formed in the third lateral direction, one row of microvias passing through right-extending protrusions and another row of microvias passing through left-extending protrusions.

By now it should be appreciated that there has been provided multiple embodiments of metal plane designs that reduce the risk of cracks forming in uninterrupted dielectric material by laterally shifting gap portions between metal planes in one or more metal layers. Protrusions and recesses may be implemented, intervening metal portions may be implemented, metal post may be implemented, or any combination thereof may be implemented in one or more metal layers to improve the mechanical strength of a gap.

In one embodiment of the present disclosure, a substrate is provided, which includes: a first metal plane and a second metal plane in a first metal layer, the first and second metal planes laterally separated by a first gap of dielectric material; and a third metal plane and a fourth metal plane in a second metal layer vertically adjacent to the first metal layer, the third and fourth metal planes laterally separated by a second gap of dielectric material, wherein the second gap includes a first laterally-shifted gap portion and a second laterally-shifted gap portion, the first laterally-shifted gap portion is laterally offset from a vertical footprint of the first gap in a first lateral direction, and the second laterally-shifted gap portion is laterally offset from the vertical footprint of the first gap in a second lateral direction opposite the first lateral direction.

One aspect of the above embodiment provides that the first laterally-shifted gap portion of the second gap is formed by a first protrusion extending from the third metal plane in a first lateral direction toward the fourth metal plane across the vertical footprint of the first gap and a first complementary recess receding into the fourth metal plane in the first lateral direction.

Another aspect of the above embodiment provides that the second laterally-shifted gap portion of the second gap is formed by a second protrusion extending from the fourth metal plane in a second lateral direction opposite the first lateral direction across the vertical footprint of the first gap toward the third metal plane and a second complementary recess receding into the third metal plane in the second lateral direction.

Another aspect of the above embodiment provides that the second gap further includes: a plurality of first laterally-shifted gap portions, a plurality of second laterally-shifted gap portions, a plurality of intermediate gap portions, each intermediate gap portion having one end that connects to a respective first laterally-shifted gap portion and another end that connects to a respective second laterally-shifted gap portion.

A further aspect of the above embodiment provides that the plurality of the first laterally-shifted gap portions and the plurality of the second laterally-shifted gap portions are arranged in an alternating manner in a third lateral direction perpendicular to the first and second lateral directions, which form complementary edges of the third and fourth metal planes.

Another further aspect of the above embodiment provides that the first gap further includes: a second plurality of first laterally-shifted gap portions, a second plurality of second laterally-shifted gap portions, and a second plurality of intermediate gap portions, each intermediate gap portion having one end that connects to a respective first laterally-shifted gap portion and another end that connects to a respective second laterally-shifted gap portion, the first laterally-shifted gap portions of the first gap are not vertically aligned with the first laterally-shifted gap portions of the second gap, and the second laterally-shifted gap portions of the first gap are not vertically aligned with the second laterally-shifted gap portions of the second gap.

Another aspect of the above embodiment provides that the first and second laterally-shifted gap portions are laterally separated by an intervening metal portion having a length greater than a width of the vertical footprint of the first gap in the first metal layer, and the intervening metal portion is positioned between the third and fourth metal planes.

A further aspect of the above embodiment provides that the third metal plane has a first recess receding into a first edge of the third metal plane in a first lateral direction away from the intervening metal portion, and the fourth metal plane has a second recess receding into a second edge of the fourth metal plane in a second lateral direction opposite the first lateral direction away from the intervening metal portion.

A still further aspect of the above embodiment provides that the intervening metal portion has a first protruding edge that is separated from a recessed edge of the first recess by the first laterally-shifted gap portion and a second protruding edge that is separated from a recessed edge of the second recess by the second laterally-shifted gap portion.

A still further aspect of the above embodiment provides that the intervening metal portion has lateral sides perpendicular to the first and second protruding edges, the second gap further includes a pair of intermediate gap portions including a first intermediate gap portion adjacent to a first lateral side of the intervening metal portion and a second intermediate gap portion adjacent to a second lateral side of the intervening metal portion, and both of the first and second intermediate gap portions have one end connected to the first laterally-shifted gap portion and another end connected to the second laterally-shifted gap portion.

A still further aspect of the above embodiment provides that the intervening metal portion is one of a plurality of intervening metal portions that are regularly positioned between pairs of recesses formed on the first and second edges of the third and fourth metal planes, the first and second edges extending in a third lateral direction perpendicular to the first and second lateral direction, the second gap further includes: a plurality of first laterally-shifted gap portions and a plurality of second laterally-shifted gap portions, a respective one of the first laterally-shifted gap portions and a respective one of the second laterally-shifted gap portions laterally separated by a respective one of the intervening metal portions, a plurality of pairs of intermediate gap portions, each pair of intermediate gap portions adjacent to lateral sides of a respective intervening metal portion, and a plurality of centered gap portions formed between non-recessed portions of the first and second edges of the third and fourth metal planes, and each centered gap portion has one end connected to a respective first intermediate gap portion adjacent to a first intervening metal portion and another end connected to a respective second intermediate gap portion adjacent to a second intervening metal portion.

In another embodiment of the present disclosure, a substrate is provided, which includes: a first metal plane and a second metal plane in a first metal layer, wherein a first edge of the first metal plane and a second edge of the second metal plane are separated by a first gap of dielectric material; and a third metal plane and a fourth metal plane in a second metal layer, the third and fourth metal planes separated by a second gap of dielectric material, wherein the third metal plane is vertically adjacent to the first metal plane, the fourth metal plane is vertically adjacent to the second metal plane, the third metal plane includes a first protrusion that extends in a first lateral direction toward the fourth metal plane across a vertical footprint of the first gap, and the fourth metal plane includes a first recess that recedes in the first lateral direction away from the first protrusion of the third metal plane.

One aspect of the above embodiment provides that the first protrusion has a first protrusion edge that is laterally offset from the first edge of the first metal plane by a first length in the first lateral direction, the first recess has a first recess edge that is laterally offset from the second edge of the second metal plane by a first depth in the first lateral direction, and the first length is greater than a first width of the vertical footprint of the first gap.

A further aspect of the above embodiment provides that the first protrusion edge and the first recess edge are separated by a first gap portion of the second gap, and the first gap portion is laterally offset from the vertical footprint of the first gap in the first lateral direction.

Another aspect of the above embodiment provides that the fourth metal plane further includes a second protrusion that extends in a second lateral direction opposite the first lateral direction toward the third metal plane across the vertical footprint of the first gap, the second protrusion is located laterally adjacent to the first recess in a third lateral direction perpendicular to the first and second lateral directions, and the third metal plane includes a second recess that recedes in the second lateral direction away from the second protrusion of the fourth metal plane.

A further aspect of the above embodiment provides that the second protrusion has a second protrusion edge that is laterally offset from the second edge of the second metal plane by a second length in the second lateral direction, the second recess has a second recess edge that is laterally offset from the first edge of the first metal plane by a second depth in the second lateral direction, and the second length is greater than the first width of the vertical footprint of the first gap.

A still further aspect of the above embodiment provides that the second protrusion edge and the second recess edge are separated by a second gap portion of the second gap, and the second gap portion is laterally offset from the vertical footprint of the first gap in the second lateral direction.

Another aspect of the above embodiment provides that the first metal plane in the first metal layer implements a first pattern of alternating protrusions and recesses along the first edge, the second metal plane in the first metal layer implements a second pattern of alternating protrusions and recesses along the second edge, the second pattern complementary to the first pattern, the third metal plane in the second metal layer implements a third pattern of alternating protrusions and recesses along a third edge, the fourth metal plane in the second metal layer implements a fourth pattern of alternating protrusions and recesses along a fourth edge, the fourth pattern complementary to the third pattern.

A further aspect of the above embodiment provides that the third pattern is a mirrored version of the first pattern, and the fourth pattern is a mirrored version of the second pattern.

Another aspect of the above embodiment provides that the substrate further includes: a fifth metal plane and sixth metal plane in a third metal layer, wherein the second metal plane is above the fourth metal plane, the sixth metal plane is below the fourth metal plane, the first protrusion of the third metal plane includes a window, a microvia has one end connected to the second metal plane and another end connected to the sixth metal plane, wherein the microvia passes through the window of the first protrusion of the third metal plane.

Although the invention is described herein with reference to specific embodiments, various modifications and changes can be made without departing from the scope of the present invention as set forth in the claims below. For example, additional or fewer protrusions and recesses may be implemented in FIG. 3A. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A substrate comprising:
a first metal plane and a second metal plane in a first metal layer, the first and second metal planes laterally separated by a first gap of dielectric material; and
a third metal plane and a fourth metal plane in a second metal layer vertically adjacent to the first metal layer, the third and fourth metal planes laterally separated by a second gap of dielectric material, wherein
the second gap comprises a first laterally-shifted gap portion and a second laterally-shifted gap portion,
the first laterally-shifted gap portion is laterally offset from a vertical footprint of the first gap in a first lateral direction, and
the second laterally-shifted gap portion is laterally offset from the vertical footprint of the first gap in a second lateral direction opposite the first lateral direction,
wherein the second gap comprises:
a plurality of first laterally-shifted gap portions, including the first laterally-shifted gap portion, formed by a plurality of first protrusions extending from the third metal plane in the first lateral direction toward the fourth metal plane and a plurality of first complementary recesses receding into the fourth metal plane in the first lateral direction,
a plurality of second laterally-shifted gap portions, including the second laterally-shifted gap portion, formed by a plurality of second protrusions extending from the fourth metal plane in the second lateral direction toward the third metal plane and a plurality of second complementary recesses receding into the third metal plane in the second lateral direction,
a plurality of intermediate gap portions, each intermediate gap portion having one end that connects to a respective first laterally-shifted gap portion and another end that connects to a respective second laterally-shifted gap portion.

2. The substrate of claim 1, wherein
the first laterally-shifted gap portion of the second gap is formed by a first protrusion extending from the third metal plane in the first lateral direction toward the fourth metal plane across the vertical footprint of the first gap and a first complementary recess receding into the fourth metal plane in the first lateral direction.

3. The substrate of claim 1, wherein
the second laterally-shifted gap portion of the second gap is formed by a second protrusion extending from the fourth metal plane in the second lateral direction opposite the first lateral direction across the vertical footprint of the first gap toward the third metal plane and a second complementary recess receding into the third metal plane in the second lateral direction.

4. The substrate of claim 1, wherein
the plurality of the first laterally-shifted gap portions and the plurality of the second laterally-shifted gap portions are arranged in an alternating manner in a third lateral direction perpendicular to the first and second lateral directions, which form complementary edges of the third and fourth metal planes.

5. The substrate of claim 1, wherein
the first gap further comprises:
a second plurality of first laterally-shifted gap portions,
a second plurality of second laterally-shifted gap portions, and
a second plurality of intermediate gap portions, each intermediate gap portion having one end that connects to a respective first laterally-shifted gap portion and another end that connects to a respective second laterally-shifted gap portion,
the first laterally-shifted gap portions of the first gap are not vertically aligned with the first laterally-shifted gap portions of the second gap, and
the second laterally-shifted gap portions of the first gap are not vertically aligned with the second laterally-shifted gap portions of the second gap.

6. A substrate comprising:
a first metal plane and a second metal plane in a first metal layer, the first and second metal planes laterally separated by a first gap of dielectric material; and
a third metal plane and a fourth metal plane in a second metal layer vertically adjacent to the first metal layer, the third and fourth metal planes laterally separated by a second gap of dielectric material, wherein
the second gap comprises a first laterally-shifted gap portion and a second laterally-shifted gap portion,
the first laterally-shifted gap portion is laterally offset from a vertical footprint of the first gap in a first lateral direction, and
the second laterally-shifted gap portion is laterally offset from the vertical footprint of the first gap in a second lateral direction opposite the first lateral direction,
wherein:
the first and second laterally-shifted gap portions are laterally separated by an intervening metal portion having a length greater than a width of the vertical footprint of the first gap in the first metal layer,
the intervening metal portion is positioned between the third and fourth metal planes,
the third metal plane has a first recess receding into a first edge of the third metal plane in a first lateral direction away from the intervening metal portion, and
the fourth metal plane has a second recess receding into a second edge of the fourth metal plane in a second lateral direction opposite the first lateral direction away from the intervening metal portion.

7. The substrate of claim 6, wherein
the intervening metal portion has a first protruding edge that is separated from a recessed edge of the first recess by the first laterally-shifted gap portion and a second protruding edge that is separated from a recessed edge of the second recess by the second laterally-shifted gap portion.

8. The substrate of claim 7, wherein
the intervening metal portion has lateral sides perpendicular to the first and second protruding edges,
the second gap further comprises a pair of intermediate gap portions including a first intermediate gap portion adjacent to a first lateral side of the intervening metal portion and a second intermediate gap portion adjacent to a second lateral side of the intervening metal portion, and
both of the first and second intermediate gap portions have one end connected to the first laterally-shifted gap portion and another end connected to the second laterally-shifted gap portion.

9. The substrate of claim 8, wherein
the intervening metal portion is one of a plurality of intervening metal portions that are regularly positioned between pairs of recesses formed on the first and second edges of the third and fourth metal planes, the first and second edges extending in a third lateral direction perpendicular to the first and second lateral direction,
the second gap further comprises:
a plurality of first laterally-shifted gap portions and a plurality of second laterally-shifted gap portions, a respective one of the first laterally-shifted gap portions and a respective one of the second laterally-shifted gap portions laterally separated by a respective one of the intervening metal portions,
a plurality of pairs of intermediate gap portions, each pair of intermediate gap portions adjacent to lateral sides of a respective intervening metal portion, and
a plurality of centered gap portions formed between non-recessed portions of the first and second edges of the third and fourth metal planes, and
each centered gap portion has one end connected to a respective first intermediate gap portion adjacent to a first intervening metal portion and another end connected to a respective second intermediate gap portion adjacent to a second intervening metal portion.

10. A substrate comprising:
a first metal plane and a second metal plane in a first metal layer, wherein
a first edge of the first metal plane and a second edge of the second metal plane are separated by a first gap of dielectric material; and
a third metal plane and a fourth metal plane in a second metal layer, the third and fourth metal planes separated by a second gap of dielectric material, wherein
the third metal plane is vertically adjacent to the first metal plane,
the fourth metal plane is vertically adjacent to the second metal plane,
the third metal plane comprises a first protrusion that extends in a first lateral direction toward the fourth metal plane across a vertical footprint of the first gap, and
the fourth metal plane comprises a first recess that recedes in the first lateral direction away from the first protrusion of the third metal plane,
wherein:
the first metal plane in the first metal layer implements a first pattern of alternating protrusions and recesses along the first edge,
the second metal plane in the first metal layer implements a second pattern of alternating protrusions and recesses along the second edge, the second pattern complementary to the first pattern,
the third metal plane in the second metal layer implements a third pattern of alternating protrusions and recesses along a third edge,
the fourth metal plane in the second metal layer implements a fourth pattern of alternating protrusions and recesses along a fourth edge, the fourth pattern complementary to the third pattern,
the third pattern is a mirrored version of the first pattern, and
the fourth pattern is a mirrored version of the second pattern.

11. The substrate of claim 10, wherein
the first protrusion has a first protrusion edge that is laterally offset from the first edge of the first metal plane by a first length in the first lateral direction,
the first recess has a first recess edge that is laterally offset from the second edge of the second metal plane by a first depth in the first lateral direction, and
the first length is greater than a first width of the vertical footprint of the first gap.

12. The substrate of claim 11, wherein
the first protrusion edge and the first recess edge are separated by a first gap portion of the second gap, and
the first gap portion is laterally offset from the vertical footprint of the first gap in the first lateral direction.

13. The substrate of claim 10, wherein
the fourth metal plane further comprises a second protrusion that extends in a second lateral direction opposite the first lateral direction toward the third metal plane across the vertical footprint of the first gap,
the second protrusion is located laterally adjacent to the first recess in a third lateral direction perpendicular to the first and second lateral directions, and
the third metal plane comprises a second recess that recedes in the second lateral direction away from the second protrusion of the fourth metal plane.

14. The substrate of claim 13, wherein
the second protrusion has a second protrusion edge that is laterally offset from the second edge of the second metal plane by a second length in the second lateral direction,
the second recess has a second recess edge that is laterally offset from the first edge of the first metal plane by a second depth in the second lateral direction, and
the second length is greater than the first width of the vertical footprint of the first gap.

15. The substrate of claim 14, wherein
the second protrusion edge and the second recess edge are separated by a second gap portion of the second gap, and
the second gap portion is laterally offset from the vertical footprint of the first gap in the second lateral direction.

16. The substrate of claim 10, further comprising:
a fifth metal plane and sixth metal plane in a third metal layer, wherein
the second metal plane is above the fourth metal plane,
the sixth metal plane is below the fourth metal plane,
the first protrusion of the third metal plane comprises a window,
a microvia has one end connected to the second metal plane and another end connected to the sixth metal plane, wherein the microvia passes through the window of the first protrusion of the third metal plane.

* * * * *